United States Patent [19]
Teremy

[11] Patent Number: 5,708,855
[45] Date of Patent: Jan. 13, 1998

[54] ONE-TIME-USE CAMERA WITH BUILT-IN FLASH-EVERY-EXPOSURE DEVICE INCREMENTALLY DESTROYED AFTER EACH EXPOSURE

[75] Inventor: Paul Teremy, Rochester, N.Y.

[73] Assignee: Eastman Kodak Company, Rochester, N.Y.

[21] Appl. No.: 781,764

[22] Filed: Jan. 10, 1997

[51] Int. Cl.[6] ................................. G03B 17/02
[52] U.S. Cl. ................ 396/6; 396/542; 200/61.08; 362/11
[58] Field of Search ................ 396/6, 155, 205, 396/542; 200/61.08; 362/6, 11, 15

[56] References Cited

U.S. PATENT DOCUMENTS

| | | | |
|---|---|---|---|
| 3,598,985 | 8/1971 | Harnden, Jr. | 362/11 |
| 3,745,276 | 7/1973 | McPherson | 200/61.08 |
| 3,969,736 | 7/1976 | Lehmann | 354/127 |
| 4,030,061 | 6/1977 | Gaskell et al. | 337/409 |
| 5,418,585 | 5/1995 | Petruchik et al. | 354/76 |

*Primary Examiner*—Howard B. Blankenship
*Attorney, Agent, or Firm*—Roger A. Fields

[57] ABSTRACT

A one-time-use camera comprising a filmstrip to be successively exposed in the camera is characterized in that frangible members in the camera operate in conjunction with successive exposure of the filmstrip and are capable of being incrementally destroyed after each exposure of the filmstrip to prevent reuse of the frangible members, when the filmstrip is completely exposed, and a breaking device independent of the frangible members incrementally destroys the frangible members after each exposure of the filmstrip.

9 Claims, 3 Drawing Sheets

ONE-TIME-USE CAMERA WITH BUILT-IN FLASH-EVERY-EXPOSURE DEVICE INCREMENTALLY DESTROYED AFTER EACH EXPOSURE

FIELD OF THE INVENTION

The invention relates generally to the field of photography, and in particular to one-time-use cameras. More specifically, the invention relates to a one-time-use camera with a built-in flash-every-exposure device that is incrementally destroyed after each exposure, in order to deter unauthorized reuse of the single-use camera.

BACKGROUND OF THE INVENTION

Film and cameras that are all in one, commonly referred to as single-use or one-time-use cameras, have become well known. Typically, the one-time-use camera is a simple point-and-shoot type comprising a plastic main body part which supports a fixed-focus taking lens, a film metering mechanism with a rotatably supported metering sprocket, a manual film advance thumbwheel, a single-blade shutter, a manual shutter release button, a frame counter for indicating the number of exposures remaining for picture-taking, a direct see-through viewfinder, a film cartridge, and in some models a fixed electronic flash. A pair of plastic front and rear cover parts house the main body part between them to complete the camera unit. The rear cover part connects to the main body part and/or to the front cover part to make the main body part light-tight. A decorative cardboard outer box or label at least partially contains the camera unit and may have respective openings for the taking lens, the shutter release button, the film advance thumbwheel, the viewfinder, the frame counter, and a flash emission window for the electronic flash.

At the manufacturer, the main body part is loaded with the film cartridge and the front and rear cover parts are connected to the main body part and/or to the front cover part to complete the camera unit. Then, an exposed end of a take-up spool in the main body part is rotated to factory prewind substantially the entire length of an unexposed filmstrip from the film cartridge onto the take-up spool. Lastly, the outer box is placed on the camera unit.

During picture-taking, after the photographer takes a picture, he or she manually rotates the thumbwheel to rotate a film spool inside the film cartridge, to wind an exposed section of the filmstrip into the film cartridge. The rewinding movement of the filmstrip the equivalent of slightly more than one frame width rotates the metering sprocket to decrement the frame counter to its next lower-numbered setting and to pivot a metering lever into engagement with the thumbwheel to prevent further manual rotation of the thumbwheel. Manually depressing the shutter release button to take another picture pivots the metering lever out of engagement with the thumbwheel to permit renewed rotation of the thumbwheel. When the maximum number of exposures available on the filmstrip are exposed and the filmstrip is completely rewound into the film cartridge, the one-time-use camera is given to a photofinisher who tears the outer box off the camera unit, separates the rear cover part from the main body part, and removes the film cartridge with the filmstrip from the main body part. Then, he removes the filmstrip from the film cartridge to develop the negatives and make prints for the customer, and he forwards the used camera parts to the manufacturer for recycling, i.e. remanufacture.

There is a need recognized in the industry to prevent unauthorized recycling of one-time-use cameras in order to maintain camera quality. Unauthorized recycled cameras may be of lesser quality than authorized recycled cameras. This problem is described in prior art U.S. Pat. No. 4,890,130, issued Dec. 26, 1989. The patent offers as a solution providing a line of weakness on the rear cover part which destroys the rear cover part when it is pivoted partially away from the main body part to remove the film cartridge from the main body part.

SUMMARY OF THE INVENTION

According to one aspect of the invention a one-time-use camera comprising a filmstrip to be successively exposed in the camera is characterized in that:

frangible means in the camera operates in conjunction with successive exposure of the filmstrip and is capable of being incrementally destroyed after each exposure of the filmstrip to prevent reuse of the frangible means when the filmstrip is completely exposed; and breaking means independent of the frangible means incrementally destroys the frangible means after each exposure of the filmstrip.

According to another aspect of the invention a method of preventing reuse of a one-time-use camera in which a filmstrip is to be successively exposed comprises the steps of:

operating frangible means in the camera each time the filmstrip is exposed; and incrementally destroying the frangible means after each exposure of the filmstrip to prevent reuse of the frangible when the filmstrip is completely exposed.

DETAILED DESCRIPTION OF THE INVENTION

The invention is disclosed as being embodied preferably in a one-time-use camera with a built-in electronic flash. Because the features of a one-time-use camera with a built-in electronic flash are generally known, the description which follows is directed in particular only to those elements forming part of or cooperating directly with the disclosed embodiment. It is to be understood, however, that other elements may take various forms known to a person of ordinary skill in the art.

Figure 2:
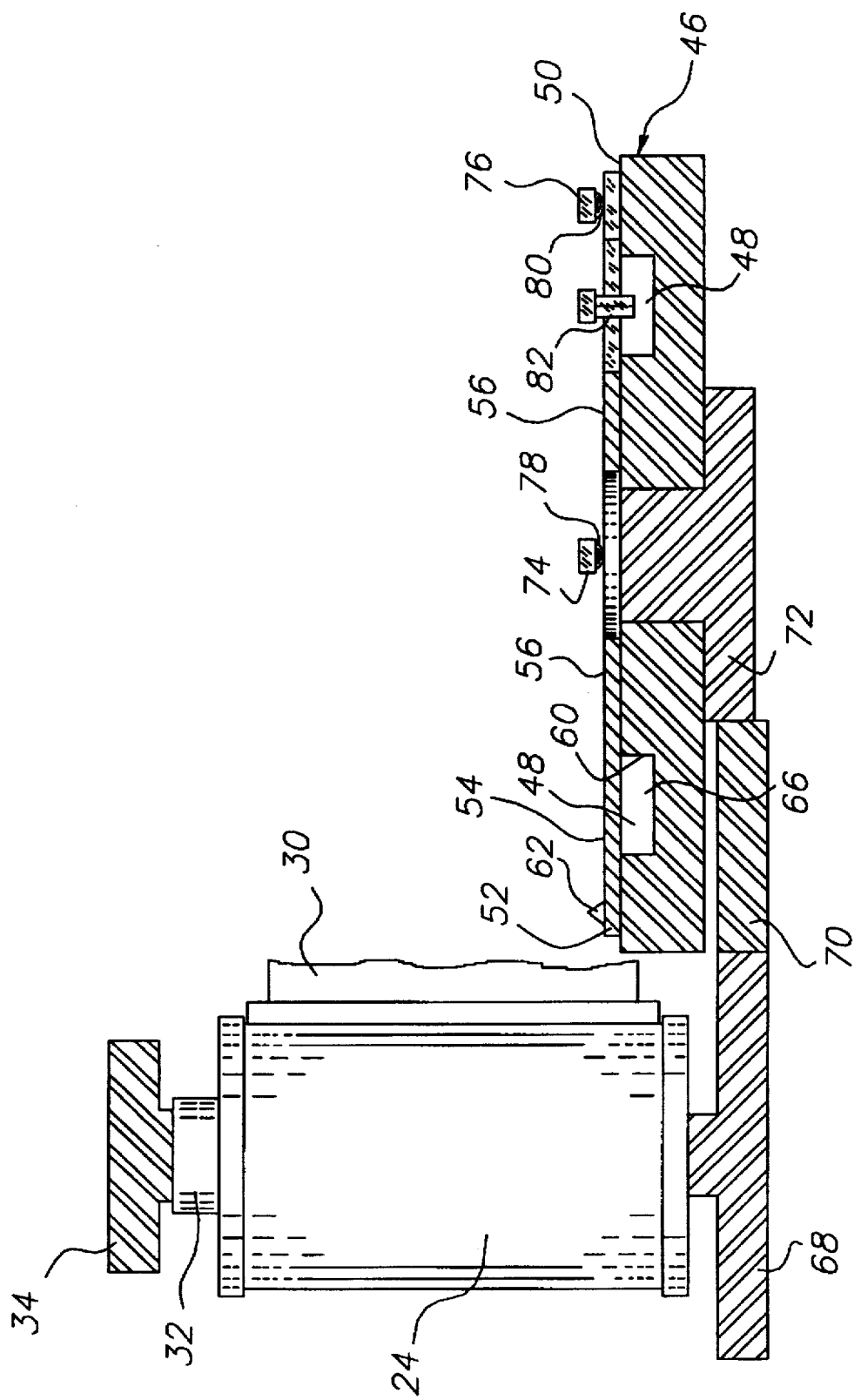
FIG. 2 is a front elevation view of the frangible means and the breaking means.
Figure 3:
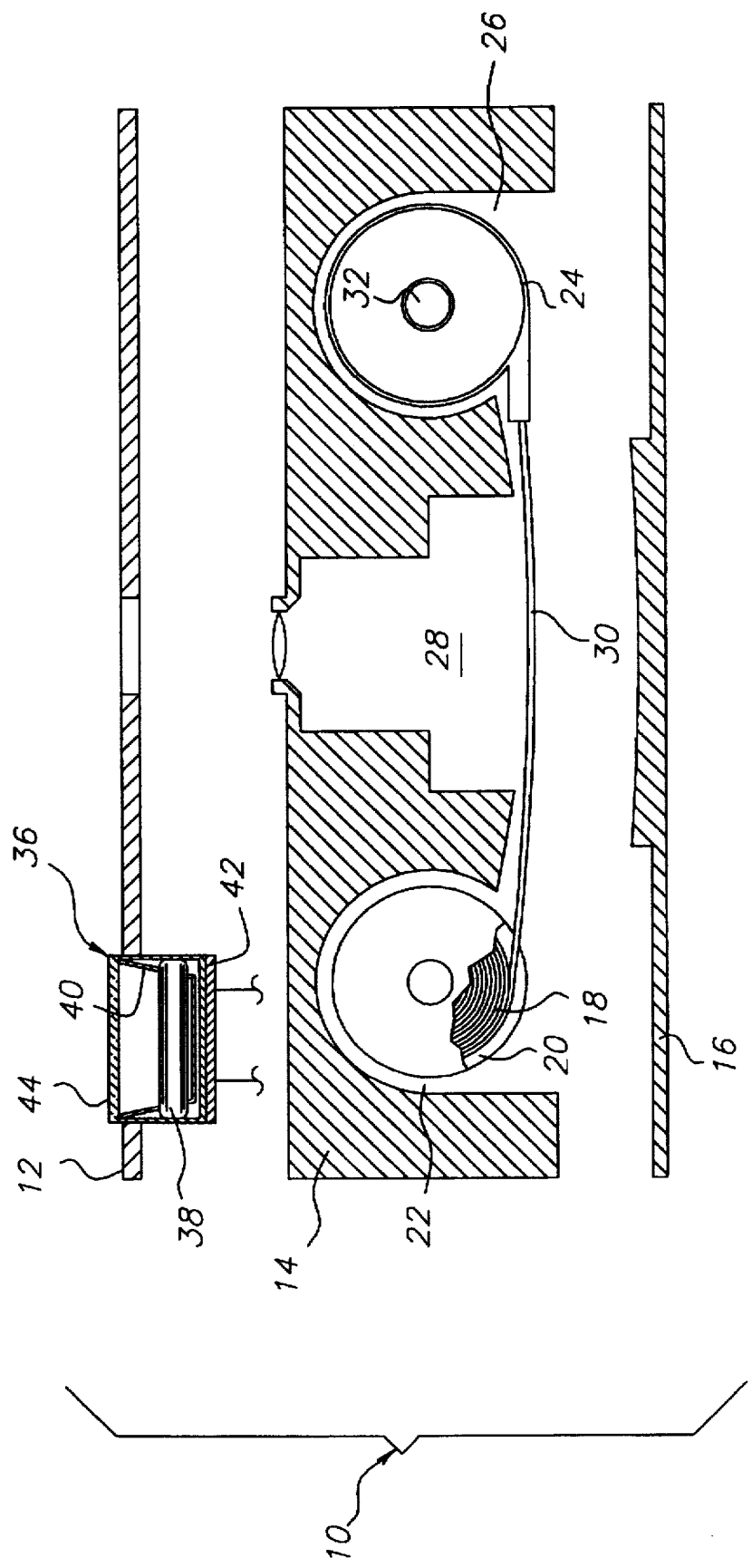
FIG. 3 is a cross-section view of a one-time-use camera in which the frangible means and the breaking means are employed, as seen in the direction of the arrows 3,3 in FIG. 1.

Referring now to the drawings, FIGS. 2 and 3 shows a one-time-use camera 10 comprising a plastic front cover part 12, a plastic main body part 14, and a plastic rear cover part 16. The main body part 12 has an unexposed film roll 18 wound onto a film supply spool 20 rotatably supported in a chamber 22, a known light-tight film cartridge 24 in a chamber 26, and a backframe opening 28 between the two chambers. A filmstrip 30 is successively exposed at the backframe opening 28 to take respective pictures. After each exposure of the filmstrip 30, the exposed section of the filmstrip is wound onto a take-up spool 32 inside the cartridge 24 and an unexposed section of the filmstrip is withdrawn off the unexposed film roll 18 and advanced to the backframe opening 28 to be positioned to make another exposure. A manual film advance thumbwheel 34 is coaxially connected to the take-up spool 32 to incrementally rotate the take-up spool to wind an exposed section of the filmstrip 30 onto the take-up spool and to position an unexposed section of the filmstrip at the backframe opening 28. When the filmstrip 30 is completely exposed, a trailing film end is wound off the supply spool 20 and onto the take-up spool 32 in the cartridge 24. As shown in FIG. 3, the rear cover 16 connects with the main body part 14 to form a light-tight casing. The front cover part 12 is provided with a known electronic flash 36 including a flash tube 38, a flash reflector 40, a flash circuit board 42, and a transparent flash diffuser 44. The electronic flash 36 provides a flash illumination for each exposure of the filmstrip 30.

Figure 1:
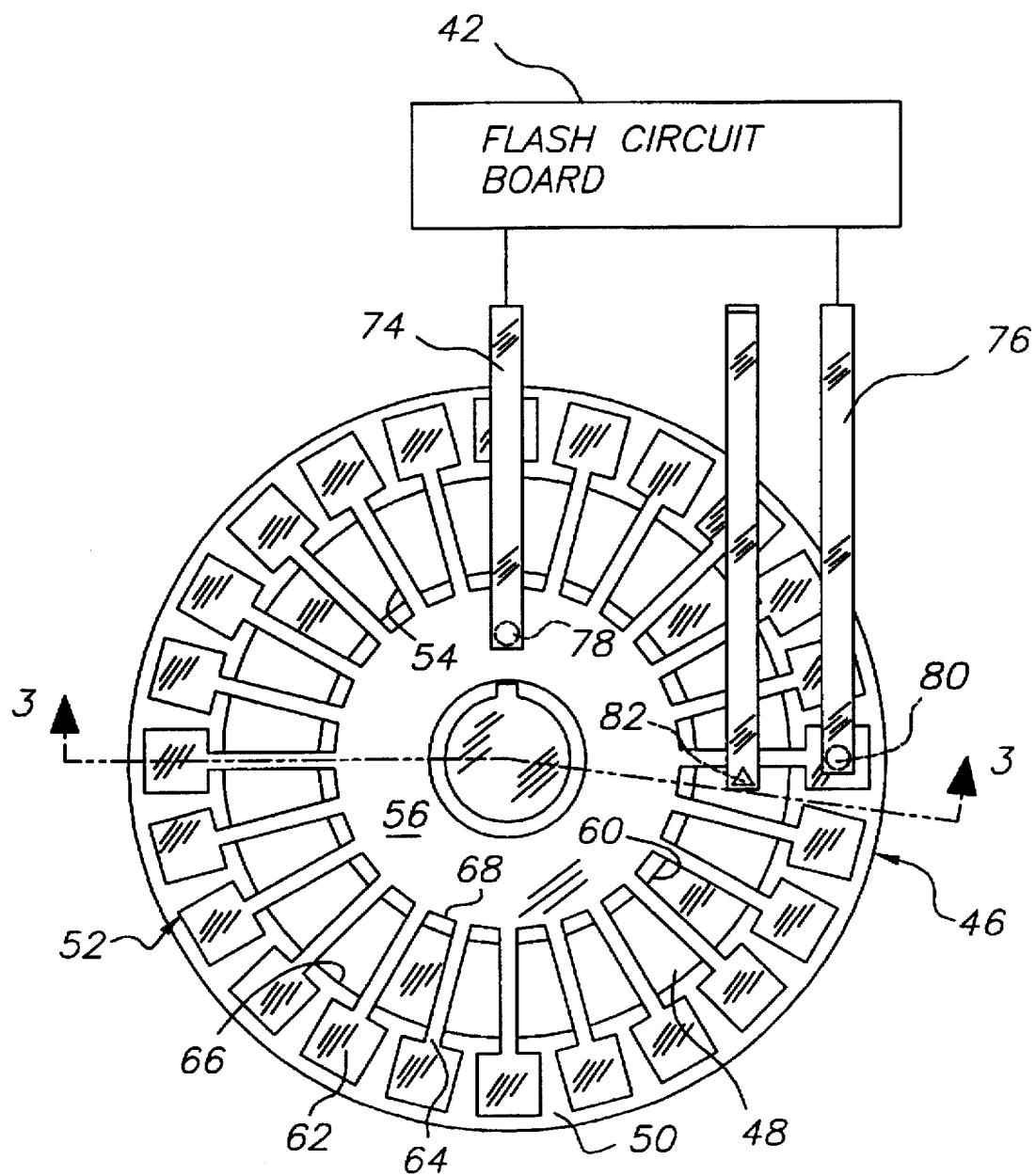
FIG. 1 is a top plan view of the frangible means and the breaking means pursuant to a preferred embodiment of the invention.

As shown in FIGS. 1 and 2, a support disk 46 has an annular groove 48 in a top face 50 of the support disk. An electrically conductive plate 52 is secured on the top face 50. The plate 52 comprises a series of conductive frangible ribbons 54 radially traversing the annular groove 48, a conductive central hub 56 integrally joined to respective inner ends 58 of the ribbons, proximate an inner side 60 of the annular groove, and a series of conductive pads 62 integrally joined to respective outer ends 64 of the ribbons, proximate an outer side 66 of the annular groove.

As shown in FIG. 2, the thumbwheel 34 is coaxially coupled via the take-up spool 32 of the cartridge 24 to a drive gear 68. The drive gear 68 is rotatably coupled via an intermediate gear 70 to a driven gear 72, which is coaxially connected to the support disk 46. When the thumbwheel 34 is manually rotated to incrementally rotate the take-up spool 32 to wind an exposed section of the filmstrip 30 onto the take-up spool and to position an unexposed section of the filmstrip at the backframe opening 28, the support disk 46 is correspondingly rotated.

A pair of conductive leads 74 and 76 connected to the flash circuit board 42 have respective fixed contacts 78 and 80. See FIGS. 1 and 2. The fixed contact 78 continuously bears against the conductive hub 56 of the plate 52 and the fixed contact 80 is positioned to successively bear against the respective conductive pads 62 of the plate when the support disk 46 is incrementally rotated. Each time the fixed contact 80 bears against one of the conductive pads 62, an electrical circuit of the flash circuit board 42 is closed or completed to permit flash illumination.

A fixed cutter 82 protrudes into the annular groove 48 in the support disk 46 to successively sever the respective frangible ribbons 54 of the plate 52 when the support disk is incrementally rotated. Severing the respective frangible ribbons 54 permanently disconnects the related conductive pads 62 of the plate 52 from the conductive hub 56 of the plate, to allow only a one-time use of each of the conductive pads. When the filmstrip 30 is completely exposed, there are no remaining ones of the conductive pads 62 to be used. Thus, the electronic flash 36 is disabled, and cannot be re-enabled unless the plate 52 is replaced with a new one.

The invention has been described with reference to a preferred embodiment. However, it will be appreciated that variations and modifications can be effected by a person of ordinary skill in the art without departing from the scope of the invention.

PARTS LIST 10 one-time-use camera
12 front cover part
14 main body part
16 rear cover part
18 unexposed film roll
20 film supply spool
22 chamber
24 film cartridge
26 chamber
28 backframe opening
30 filmstrip
32 take-up spool
34 thumbwheel
36 electronic flash
38 flash tube
40 flash reflector
42 flash circuit board
44 flash diffuser
46 support disk
48 annular groove
50 top face
52 plate
54 frangible ribbons
56 hub
58 inner ends
60 inner side
62 pads
64 outer ends
66 outer side
68 drive gear
70 intermediate gear
72 driven gear
74 lead
76 lead
78 contact
80 contact
82 cutter

What is claimed is:

1. A one-time-use camera comprising a filmstrip to be successively exposed in said camera, is characterized in that:
   a frangible component in said camera operates in conjunction with successive exposure of said filmstrip and is capable of being incrementally destroyed after each exposure of the filmstrip to prevent reuse of said frangible component when the filmstrip is completely exposed;
   a breaking cutter incrementally destroys the frangible component after each exposure of said filmstrip; and
   said frangible component and said breaking cutter are supported for movement of one relative to the other after each exposure of said filmstrip to allow the breaking cutter to incrementally destroy the frangible component.

2. A one-time-use camera as recited in claim 1, wherein a spool is incrementally rotatable to wind said filmstrip onto said spool after each exposure of the filmstrip, and a manually rotated film advance thumbwheel is coaxially connected to said spool and to said frangible component to incrementally rotate the spool to wind said filmstrip onto the spool after each exposure of the filmstrip and at the same time to incrementally rotate the frangible component relative to said breaking cutter for the cutter to incrementally destroy the frangible component.

3. A one-time-use camera as recited in claim 1, wherein an electronic flash is used to provide a flash illumination for each exposure of said filmstrip, and said frangible component includes a series of electrically conductive members which can be coupled with said electronic flash to effect flash illumination and are successively destroyed after each exposure of the filmstrip to prevent their reuse to effect flash illumination.

4. A one-time-use camera as recited in claim 3, wherein said breaking cutter severs the respective electrically conductive members, and said series of electrically conductive members and said breaking cutter are supported for incremental movement of one relative to the other after each exposure of said filmstrip for the cutter to successively sever the respective electrically conductive members.

5. A one-time-use camera as recited in claim 4, herein said frangible component includes a rotatable support disk having an annular groove on one face of said support disk, said respective electrically conductive members are located on said face of the support disk to radially extend across said annular groove, and said breaking cutter is fixed to protrude into said annular groove to successively sever the respective electrically conductive members when said support disk is rotated.

6. A one-time-use camera as recited in claim 5, wherein a spool is incrementally rotatable to wind said filmstrip onto said spool after each exposure of the filmstrip, and a manually rotated film advance thumbwheel is coaxially connected to said spool and to said support disk to incrementally rotate the spool to wind said filmstrip onto the spool after each exposure of the filmstrip and at the same time to incrementally rotate the support disk relative to said breaking cutter for the cutter to successively sever the respective electrically conductive members.

7. A one-time-use camera as recited in claim 5, wherein said respective electrically conductive members are integrally formed at similar ends with a common electrically conductive hub located on said face of the support disk, proximate one side of said annular groove, and are integrally formed at opposite ends with individual conductive pads located on the face of the support disk, proximate another side of the annular groove, and said electronic flash includes separate electrical leads in continuous contact with said electrically conductive hub and in successive contact with said individual conductive pads as the support disk is rotated.

8. A method of preventing reuse of a one-time-use camera in which a filmstrip is to be successively exposed, comprising the steps of:

operating a frangible component in the camera each time the filmstrip is exposed; and moving one of the frangible component and a breaking cutter relative to the other after each exposure of the filmstrip for the cutter to incrementally destroy the frangible component to prevent reuse of the frangible component when the filmstrip is completely exposed.

9. A method as recited in claim 8, wherein an electronic flash is used to provide a flash illumination for each exposure of said filmstrip, the frangible component includes a series of electrically conductive members which can be coupled with the electronic flash to effect flash illumination, and the breaking cutter successively destroys the respective electrically conductive members after each exposure of the filmstrip to prevent their reuse to effect flash illumination.

* * * * *